(12) United States Patent
Nicholls et al.

(10) Patent No.: US 6,711,230 B1
(45) Date of Patent: Mar. 23, 2004

(54) REFERENCE TIMING SIGNAL OSCILLATOR WITH FREQUENCY STABILITY

(75) Inventors: Charles Nicholls, Nepean (CA); Gregory Carleton, Ottawa (CA); Philippe Wu, Kanata (CA); Yu Yang, Kanata (CA); Eric Gagnon, Chelsea (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/255,835

(22) Filed: Sep. 27, 2002

(51) Int. Cl.[7] ................................................. H03L 7/06
(52) U.S. Cl. ........................... 375/376; 331/18; 327/147
(58) Field of Search ............................... 331/18, 16, 17, 331/25, 176; 327/147, 156; 375/376

(56) References Cited

U.S. PATENT DOCUMENTS

| 5,144,595 A | | 9/1992 | Graham et al. ............ 367/135 |
|---|---|---|---|
| 5,473,640 A | * | 12/1995 | Bortolini et al. ............ 375/376 |
| 5,542,113 A | * | 7/1996 | Fink et al. .................. 455/119 |
| 5,697,082 A | | 12/1997 | Greer et al. ................ 455/255 |
| 6,028,900 A | * | 2/2000 | Taura et al. ................ 375/344 |
| 6,148,045 A | * | 11/2000 | Taura et al. ................ 375/344 |
| 6,194,970 B1 | | 2/2001 | Nielsen et al. .............. 331/16 |
| 2002/0190764 A1 | * | 12/2002 | Nichols ..................... 327/156 |
| 2003/0090333 A1 | * | 5/2003 | Kobayashi et al. ......... 331/176 |

* cited by examiner

Primary Examiner—Robert Pascal
Assistant Examiner—Joseph Chang

(57) ABSTRACT

An input reference timing signal oscillator of a phase-locked loop has a computer algorithm which adaptively models the multiple frequencies of an oscillator following a training period. The oscillator is part of a phase-locked loop and the oscillation frequency thereof is controlled in response to the phase detector output. The computer algorithm processes the control signal applied to the oscillator. The computer algorithm updates the characteristics of the model relating to the aging and temperature of the oscillator, using for example, a Kalman filter as an adaptive filter. By the algorithm, the subsequent model predicts the future frequency state of the oscillator on which it was trained. The predicted frequency of the model functions as a reference to correct the frequency of the oscillator in the event that no input reference timing signal is available. With the model updating algorithm, oscillators of low stability performance may be used as cellular base station reference oscillator.

32 Claims, 9 Drawing Sheets

REFERENCE TIMING SIGNAL OSCILLATOR WITH FREQUENCY STABILITY

TECHNICAL FIELD

The present invention relates to a reference timing signal oscillator which oscillates in phase-lock with a reference input signal and more particular to a reference timing signal oscillator, the frequency of which is stabilized in the event of no reference input signal. The reference timing signal oscillator is applicable to a cellular telephone base station for example. The present invention is also applicable to reference signal or clock signal generators in other types of apparatus, for example, optical transport networks.

BACKGROUND INFORMATION

A known cellular telephone system is a Code Division Multiple Access (CDMA) system. The CDMA wireless phone system allows multiple cellular phone users to share the same frequency spectrum, and uses a generated noise carrier with a different and essentially orthogonal instance of the noise carrier assigned to each mobile unit within a cell. The base station receiver in a CDMA station correlates the received signal from a mobile unit with the desired noise carrier, extracting the transmitted digital signal with a sufficient signal-to-noise ratio to achieve a satisfactory data error rate. Because the base stations in a system such as CDMA must be synchronized with surrounding base stations to handle handoff of mobile phones between cells and for other functions, a time reference must be provided to each base station. This is commonly provided via Global Positioning System (GPS) receivers which comprise a part of each base station. GPS satellites each provide radio signals that are synchronized and usable by GPS receivers not only to derive one's physical position relative to the satellites but also to derive a very accurate time reference. Because the GPS receiver antennas of cellular phone equipment are often placed high relative to surrounding terrain, they are subject to lightning damage in addition to physical damage from rough handling or other damage. CDMA base stations which lose contact with GPS satellites should ideally continue to operate during this holdover period until contact can be reestablished, whether through repair of damaged equipment, or other changed circumstances. A crystal oscillator may provide a time reference during this holdover period, as long as the oscillator is stable enough to keep the base station sufficiently synchronized with other base stations.

A method is needed for improving on the performance of current CDMA base station clock stability when the base station is not receiving a GPS signal to provide a clock reference. When no GPS signal is received the system clock operates in holdover mode, and the clock signal is generated by a crystal oscillator designed to provide a signal of the same frequency as is provided by the GPS receiver. It is necessary to improve current GPS-based clock stability during holdover by compensating for the performance of a crystal used to generate a clock signal during this holdover period.

A typical CDMA base station uses a received GPS signal to produce a reference clock signal to ensure that CDMA stations are synchronized in operation. Such synchronization between stations is important to the proper operation of a CDMA system, as common operations such as a CDMA spread spectrum code search and station-to-station handoff require that stations be closely synchronized in time. Mobile stations also synchronize to the signals provided by the base station, such that the GPS clock provides a timing reference for both the base station and all mobile stations active within the cell.

This synchronization is jeopardized when the base station fails to receive a GPS signal, and must rely on an oscillator to maintain time independent of the GPS signal still used by neighboring base stations. This commonly occurs as a result of lightning strikes that damage the GPS antenna or receiver of a CDMA system, and also occurs as a result of damage due to rough handling and vandalism or from other causes. If the oscillator is not sufficiently stable, the time it provides to the base station may drift with respect to the desired GPS reference time, and cause the base station to fail to communicate properly.

Currently, a new oven-controlled crystal oscillator (OCXO) used to provide a holdover clock signal in a CDMA system is burned in and tested in operation for frequency stability for no more than a few days. Crystals that perform adequately are then accepted for service and placed in use as part of a CDMA base station. But, because crystals often take from 20 to 30 days to settle in or become stable in performance, this test cannot ensure performance of the crystal in extended operation. Excessive frequency drift due to molecular settling or spurious frequency jumps due to contaminants in the crystal may cause the crystal to perform much more poorly in the field than these preliminary tests could indicate. Other factors such as rough handling during installation or spurious mechanical changes in the crystal may further degrade crystal stability, and are not detectable after initial testing. In order to reduce base station cost, lower cost reference oscillator may be used. However, in general, the frequency stability of low cost OCXOs is poor and thus, the frequency stability in the holdover period is not reliable. It must be ensured that the increased frequency drift in the low cost OCXOs used as base station reference oscillators is compensated sufficiently to maintain the required level of base station synchronization.

U.S. Pat. No. 6,194,970 issued to Nielsen et al. on Feb. 27, 2001 discloses an oscillator stability monitoring and compensation system for analyzing the steering voltage applied to a crystal oscillator over time and compensating for spurious frequency jumps in determining the drift rate of a crystal oscillator. The steering voltage is used to estimate oscillator stability by comparing a projected steering voltage against an actual voltage after a simulated holdover period, or analyzing a steering voltage recorded over a period of time and evaluating rates of change. Spurious frequency jumps are removed from data collected while not in an actual holdover, making the data more accurately represent the frequency drift rate of the oscillator. The rate of occurrence of spurious frequency jumps while not in holdover may be monitored to provide information regarding the physical condition of the crystal. However, the system is directed to detect spurious frequency jumps in the crystal and compensate for these jumps in charactering the performance of the crystal. It does not address the problem of a low performance reference oscillator.

U.S. Pat. No. 5,697,082 issued to Greer et al. on Dec. 9, 1997 discloses a self-calibrating frequency standard system self-calibrating a clock of a communication terminal for use with communication systems in which a central communication node generates time base correction signals for the terminal clock includes a terminal oscillator which generates an oscillator frequency that includes an error amount. An oscillator calibration filter generates a frequency error estimate amount. The frequency error estimate amount generated by the calibration filter is subtracted from the oscillator frequency error amount. The time base correction signals are applied to the calibration filter to thereby modify the frequency error estimate amount generated by the calibration filter based upon the time base correction signals generated by the communication central node. It does not address the problem of low performance reference oscillator, either.

For example, in the North American synchronous CDMA, it is required to meet with all reference oscillator specifications with respect to the accumulated timing error over the holdover period. An example of specification for a compact base transceiver system (BTS) is 6.9 microseconds cumulative timing error in 24 hours, which translates to a frequency stability requirement of 0.08 parts per billion on the 10 MHz reference oscillator. It is noted that the holdover specifications include all operating condition variations, the most severe of which from a crystal oscillator design standpoint, is the −5 Celsius to +70 Celsius ambient temperature range.

The simplest approach to the problem of determining the oscillator frequency when a more stable reference is unavailable is to avoid the requirement for doing so altogether. In order not to have to know the oscillator frequency during the holdover period, the problem is that one of ensuring the cumulative time error of the free running oscillator remains within the specified 6.9 microseconds. To achieve the required level of stability directly from the oscillator without recourse to any form of control loop places severe demands on the crystal cut and thermal stabilization through the use of double oven architectures. It is, thus, required to improve the oscillator long term stability with low cost. For example, rubidium oscillators and conventional double oven crystal oscillator are still expensive.

SUMMARY OF THE INVENTION

It is an object of the present invention to provide an improved reference timing signal oscillator, the frequency of which is stabilized in the event of no reference input signal.

The present invention is directed to a phase-locked loop (PLL) for providing a timing output signal, in one aspect. The PLL comprises an oscillator, a difference detector and a processor. In the PLL, an oscillator generates an oscillation output signal in response to a control component (e.g., voltage) of an input control signal. The difference detector detects a difference between the oscillation output signal and an input reference timing signal, when the input reference timing signal is available. A difference signal is provided, in accordance with the detected difference, to the processor. The processor varies the control component of the input control signal in accordance with the detected difference and a frequency dependent element relating to the oscillator. The frequency dependent element is provided in accordance with a characteristic model. The model is updateable in accordance with the difference detected by the difference detector, when the input reference timing signal is available. The oscillator is controlled in accordance with the control component varied by the processor and the frequency of the oscillation output signal generated thereby is controlled.

For example, in a case where the PLL including the oscillator is used as a reference timing signal oscillator in a cellular base station, the input reference timing signal is available from a cellular receiver when it is locked and the input reference signal is unavailable when signal receiving is interrupted, that is, a holdover period.

For example, the processor includes first and second processing units. The first processing unit provides a first characteristic in accordance with a first parameter of a first model included in the characteristic model. The first parameter is relating to an aging characteristic of the oscillator. The first processing unit updates the first parameter in accordance with the detected difference, when the input reference timing signal is available. The first processing unit updates the first parameter in accordance with its past or preceding parameter, when the input reference timing signal is unavailable.

The second processing unit provides a second characteristic in accordance with a second parameter of a second model of the characteristic model. The second parameter is relating to a temperature characteristic of the oscillator. The second processing unit updates the second parameter in accordance with the difference signal, the first characteristic provided by the first processing unit and a temperature in relation to the oscillator, when the input reference timing signal is available. The second processing unit updates the second parameter in accordance with its past or preceding parameter, when the input reference timing signal is unavailable. The first and second characteristics are combined to produce the characteristic signal to vary the frequency of the oscillation output signal of the oscillator. Since the first and second parameter relates to frequency dependent elements on the frequency of the oscillator, with adaptively updating of the characteristic model, the frequency change to the oscillation signal over time is compensated.

The second processing unit may also update the second parameter in accordance with the detected difference, the first characteristic provided by the first processing unit, a temperature in relation to the oscillator and a voltage in relation to the oscillator. In this processing unit, the frequency of the oscillator is controlled in accordance with the voltage which may affect the oscillation. The temperature and voltage are obtained by their respective sensors implemented into the oscillator.

In a case where the reference timing signal oscillator including the PLL is applied to a base station, for example, it improves current GPS-based clock stability during holdover by better estimating and compensating for the performance of a crystal used to generate a clock signal during the holdover period.

Advantageously, each of the two processing units may include an update determiner for determining whether the respective parameter is updated, regardless of the availability of the input reference timing signal. The determination is made in accordance with a predetermined period, wherein the respective processing unit updates the parameter in accordance with its preceding past parameter. Due to this determination, when the input reference timing signal is available, the first and second processing units update the first and second parameters in accordance with their preceding parameter values, respectively. This is done periodically, in accordance with the oscillation frequency.

According to another aspect of the present invention, there is provided a method for providing an accurate timing output signal when an input reference timing signal is unavailable. In the method, a difference between an oscillation output signal of an oscillator and an input reference timing signal is detected when the input reference timing signal is available to provide a difference signal. A control component (e.g., voltage) of the input control signal applied to the oscillator is changed in accordance with the detected difference and a frequency dependent element relating to the oscillator. The frequency dependent element is provided in accordance with a characteristic model. The model is updateable in accordance with the detected difference, when the input reference timing signal is available. A frequency of the oscillation output signal is controlled in accordance with the varied control component. The timing output signal is provided in accordance with the oscillation output signal.

For example, the characteristic model is adaptively updated in accordance with aging and temperature characteristics relating to the oscillator. Since the first and second parameters of the model relate to frequency dependent elements on the frequency of the oscillator, with adaptively updating of the characteristic model and the parameters, the frequency change to the oscillation signal over time is compensated.

According to another aspect of the present invention, there is provided an apparatus for generating a reference signal for use in a cellular base station, the apparatus comprising: a receiver for generating an input reference timing signal when a cellular signal is available; an oscillator for generating an oscillation output signal in response to a control component of an input control signal; a difference detector for detecting a difference between the oscillation output signal and the input reference timing signal when the input reference timing signal is generated, thereby providing a difference signal; and a processor for varying the control component of the input control signal applied to the oscillator in accordance with the difference detected by the difference detector and a frequency dependent element relating to the oscillator, the frequency dependent element being provided in accordance with a characteristic model that is updateable in accordance with the difference signal provided by the difference detector when the input reference timing signal is generated, a frequency of the oscillation output signal generated by the oscillator being controlled in accordance with the varied control component of the input control signal.

The model updating may be performed by a computer algorithm. With such model updating, oscillators of low stability performance may be used as cellular base station reference oscillator, because high frequency stability is achieved. In order to update the characteristic model, adaptive algorithm may be used. For example, an adaptive filter is used for the adaptive algorithm.

BRIEF DESCRIPTION OF THE DRAWINGS

Examples of the present invention will now be described in relating to the accompanied drawings in which.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the present invention, and it is to be understood that other embodiments may be utilized and that logical, mechanical, electrical, and other changes may be made without departing from the scope of the present invention. The following detailed description is, therefore, not to be taken in a limiting sense, and the scope of the present invention is defined only by the appended claims.

The present invention is applicable to a computer algorithm which adaptively models the multiple frequency dependent characteristics in relation to an oscillator following a "training period". The subsequent model predicts the future frequency state of the oscillator on which it was trained. The predicted frequency of the model functions as a reference to correct the oscillator frequency in the event that no other stable correction signal is available. The algorithm may be implemented in firmware. The computer algorithm may be provided with an adaptive filter.

I. Outline of Embodiment

Figure 1:
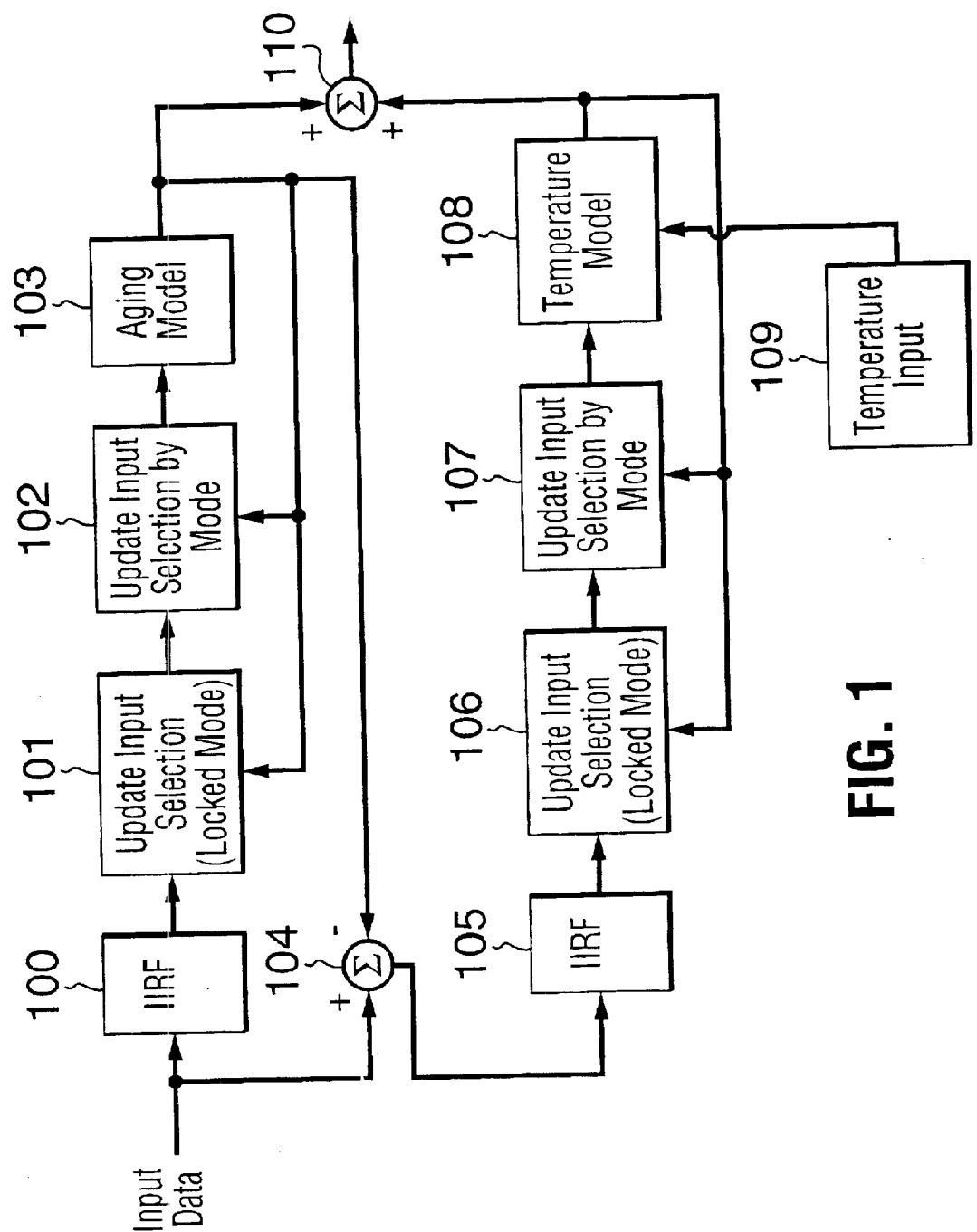
FIG. 1 illustrates the function of blocks of one embodiment according to the present invention.

FIG. 1 illustrates the function implemented in one embodiment according to the present invention which provides a clock signal in a CDMA base station (not shown). There are two operating modes: GPS locked mode and holdover mode. Referring to FIG. 1, raw input data of the frequency of an oscillator (not shown) is fed to an infinite impulse response filter (IIRF) 100 which in turn provides its IIRF filtered output data to a locked mode input selector 101. The locked mode input selector 101 selects update input data and its selected data is fed to a GPS-holdover input selector 102 which provides data selected in accordance with a mode to an aging model calculator 103. In the GPS locked mode, the data selected by the locked mode input selector 101 is fed to the aging model calculator 103. The aging model calculator 103 calculates Kalman filter function values in accordance with the input data and updates an aging model thereof, so that the future frequency state of the oscillator is predicted from the updated model. The aging model relates to the aging characteristic of the oscillator. In accordance with the updated model, output data is fed from the output of the aging model calculator 103 to the locked mode input selector 101 and the GPS-holdover input selector 102. In the event that the aging model needs to be periodically updated by its preceding state, the locked mode input selector 101 selects the output data of the aging model calculator 103 as input data, so that the output data is fed back to the input of the aging model calculator 103. Accordingly, the aging model is updated by the preceding state. In the holdover mode, the input data is unavailable and the GPS-holdover input selector 102 selects the output data of the aging model calculator 103 and feeds it back to the input thereof, so that the aging model of the aging model calculator 103 is updated in accordance with its preceding state in the holdover period.

The input data is subtracted by the output data of the aging model calculator 103 in a subtractor 104 and the subtracted data is fed to an IIRF 105. The IIRF filtered output data is fed to a locked mode input selector 106. The locked mode input selector 106 selects update input data and its selected data is fed to a GPS-holdover input selector 107 which provides selected data, in accordance with a mode, to a temperature model calculator 108. In the GPS locked mode, the data selected by the locked mode input selector 106 is fed to the temperature model calculator 108. Also, a temperature sensor 109 provides the temperature model calculator 108 with temperature input data that relates to the oscillator. The temperature model calculator 108 calculates Kalman filter function values in accordance with the input data and updates a temperature model thereof, so that the future frequency state of the oscillator is predicted from the updated model. The temperature model relates to the temperature characteristic of the oscillator. In accordance with the updated model, output data is fed from the output of the temperature model calculator 108 to the locked mode input selector 106 and the GPS-holdover input selector 107. In the event that the temperature model needs to be periodically updated by its preceding state, the locked mode input selector 106 selects the output data of the temperature model calculator 108 as input data, so that the output data is fed back to the input of the temperature model calculator 108. The temperature model is updated by the preceding state. In the holdover mode, the input data is unavailable and the GPS-holdover input selector 107 selects the output data of the temperature model calculator 108 and feeds it back to the input thereof, so that the temperature model of the temperature model calculator 108 is updated in accordance with the preceding state in the holdover period.

The aging model calculator 103 and the temperature model calculator 108 update their models adaptively. Such update function is achieved by adaptive algorithm. The Kalman filters are used to perform the adaptive algorithm function, as example, in the embodiment.

The output data of the aging model calculator 103 and the temperature model calculator 108 is fed to an adder 110 which provides added data. The added data represents a predicted frequency dependent element in accordance with the aging and temperature characteristics. The predicted frequency element is provided to the oscillator, so that the oscillator changes its oscillation frequency in accordance with the predicted frequency element, regardless of the GPS locked mode or the holdover mode. Therefore, the oscillation frequency is controlled in accordance with the models' elements updated by input data in the GPS-mode (a training period) and with the models' elements in the holdover mode, the elements having been updated in the training period.

II. Detail of Embodiment

Figure 2:
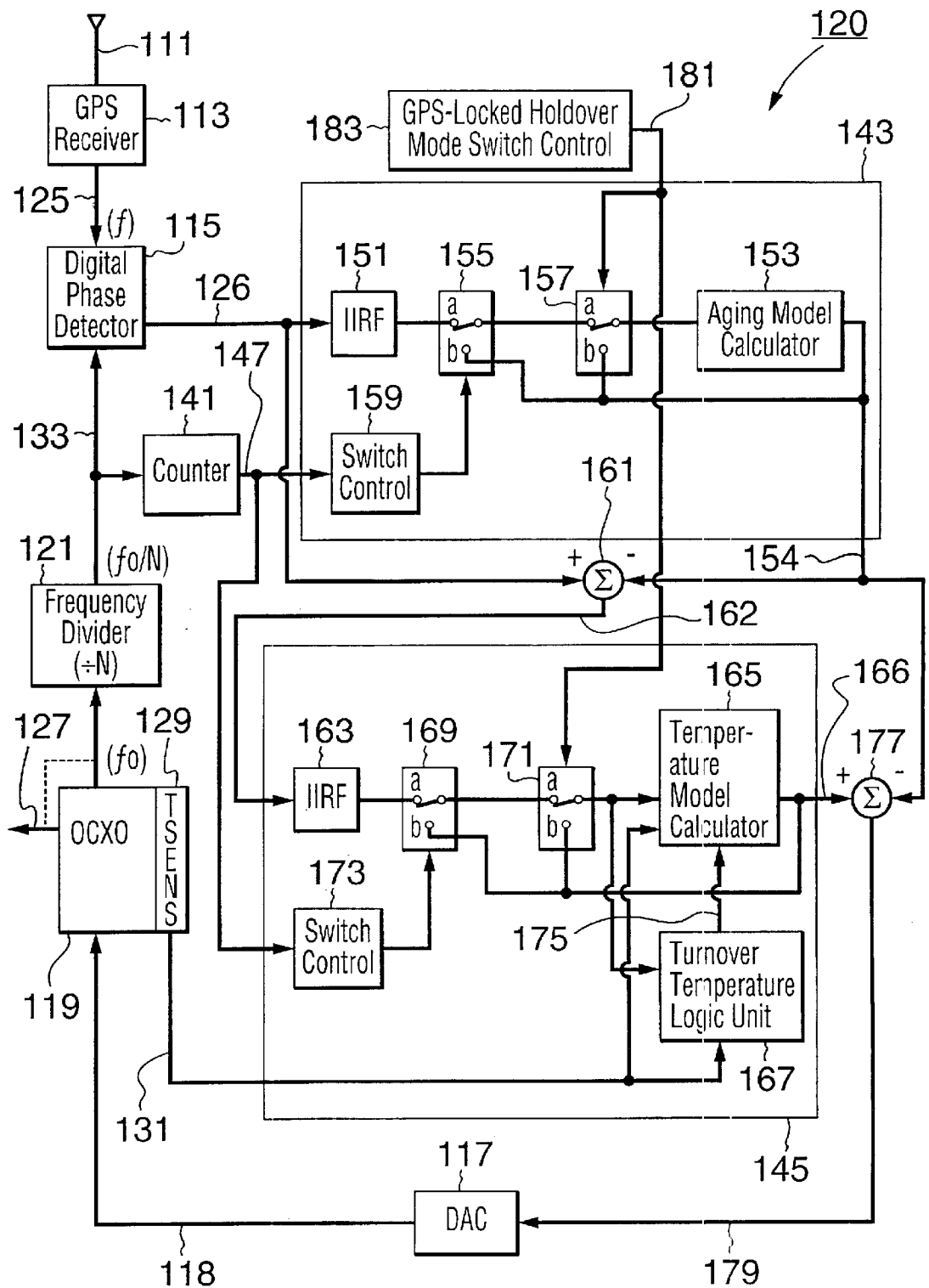
FIG. 2 is a block diagram of a reference timing signal oscillator used in a CDMA base station according to one embodiment of the present invention.

FIG. 2 shows an oscillator with phase-locked loop (PLL) according to one embodiment of the present invention which provides a clock signal in a CDMA base station. The function of each block or unit shown in FIG. 2 corresponds to that of each of block shown in FIG. 1.

In FIG. 2, an antenna 111 is connected to a GPS receiver 113. The GPS receiver 113 is connected to a PLL including a digital phase detector 115, a digital-to-analog converter (DAC) 117, an oven-controlled crystal oscillator (OCXO) 119 and a frequency divider 121. Also, the PLL includes a compensation processor 120 for compensating frequency drift over time. In normal operation (a GPS locked mode), an input reference timing signal 125 (GPS-generated timing signal) is available from the GPS receiver 113 and the OCXO 119 is locked with the input reference timing signal 125 and a base station reference timing signal 127 is provided by the PLL (and the OCXO 119). In the normal operation, in response to the input reference timing signal 125 received from the GPS receiver 113, the PLL closely tracks the GPS-generated timing signal. During the holdover period (i.e., in the event that the input reference timing signal 125 is unavailable), the base station reference timing signal 127 is provided by the OCXO 119 that had been phase-locked and is self-oscillated. The OCXO 119 has a temperature sensor (TSENS) 129 which provides a temperature signal 131 representing sensed temperature in relation to the OCXO 119. The compensation processor 120 compensates frequency drift of the OCXO 119 over time and in response to the temperature signal 131.

The digital phase detector 115 of the PLL detects the difference in phase between the input reference timing signal 125 (the GPS-generated timing signal) and the base station reference timing signal 127 provided by the OCXO 119. A phase detect output signal 126 from the digital phase detector 115 is filtered and processed by the compensation processor 120 which operates as a filter in the locked mode. A digital voltage signal is fed by the compensation processor 120 to the DAC 117 which provides the OCXO with an analog steering voltage of an electronic frequency control (EFC) input signal 118. The EFC input signal 118 has an analog steering voltage as a control component applied to the OCXO 119 to vary the oscillation frequency. The OCXO 119 produces the base station reference timing signal 127 having a frequency of which is fed to the frequency divider 121 having a division factor N. A frequency divided output signal 133 having a frequency of of/N is fed to the digital phase detector 115. The phase detect output signal 126 from the digital phase detector 115 is fed back to the compensation processor 120 to adjust the output voltage applied to the OCXO 119 through the DAC 117, so that the phase difference between the input reference timing signal 125 and the frequency divided output signal 133 is minimized. This PLL-based feedback circuitry therefore steers the frequency of the OCXO 119 to provide the base station reference timing signal 127 having a frequency of of (=Nf), f being the frequency of the input reference timing signal 125. The base station reference timing signal 127 may be obtained from the frequency divider 121, the frequency of which is of/N.

The compensation processor 120 includes a counter 141, an aging characteristic processing unit 143 and a temperature characteristic processing unit 145. The counter 141 counts pulses of the frequency divided output signal 133 to provide a frequency count signal 147 to the aging characteristic processing unit 143 and the temperature characteristic processing unit 145. When the GPS-generated timing signal is available (i.e., the input reference timing signal 125 is provided by the GPS receiver 113), the phase detect output signal 126 is fed to an IIRF 151 of the aging characteristic processing unit 143. The filtered output signal from the IIRF 151 is fed to an aging model calculator 153 through an aging model update switch 155 and a GPS-holdover mode switch 157 when both switches are connected to their terminals "a". Each of the aging model update switch 155 and the GPS-holdover mode switch 157 has two terminals "a" and "b".

The terminals "b" of the both switches are commonly connected to an output terminal of the aging model calculator 153. The connection of the GPS-holdover mode switch 157 is controlled by a mode switching signal 181 provided by a switch controller 183 in accordance with the availability of the GPS-generated timing signal. The GPS-holdover mode switch 157 is connected to its terminals "a" and "b", when the GPS-generated timing signal is available and unavailable (i.e., the holdover period), respectively.

The frequency count signal 147 from the counter 141 is fed to a switching controller 159 of the aging characteristic processing unit 143 which controls the connections of the aging model update switch 155 to its terminal "a" and "b". The switching controller 159 determines whether the clock value Clk represented by the frequency count signal 147 is equal to m×Int, wherein m is an update rate for aging model and Int is a predetermined maximum value (an integer). An example of the update rate m is one every 45 min. In a case of Clk being m×Int, the switching controller 159 controls the aging model update switch 155 to be connected to its terminal "a". In a case of Clk being not m×Int, the switching controller 159 controls the aging model update switch 155 to be connected to its terminal "b".

The phase detect output signal 126 and an aging model output signal 154 of the aging model calculator 153 are fed to a subtractor 161, the output signal of which is fed to an IIRF 163 of the temperature characteristic processing unit 145. The filtered output signal from the IIRF 163 is fed to a temperature model calculator 165 and a turnover temperature logic unit 167 through an aging model update switch 169 and a GPS-holdover mode switch 171 when both switches are connected to their terminals "a". Each of the temperature model update switch 169 and the GPS-holdover mode switch 171 has two terminals "a" and "b". The terminals "b" of both switches are commonly connected to an output terminal of the temperature model calculator 165. The connection of the GPS-holdover mode switch 171 is controlled by the mode switching signal 181 provided by the switch controller 183 in accordance with the availability of the GPS-generated timing signal. The GPS-holdover mode switch 171 is connected to its terminals "a" and "b", when the GPS-generated timing signal is available and unavailable, respectively. The frequency count signal 147 is fed to a switching controller 173 of the temperature characteristic processing unit 145 which controls the temperature model update switch 169 to be connected to its terminals "a" and "b". The switching controller 173 determines whether the clock value Clk represented by the frequency count signal 147 is equal to p×Int, wherein p is an update rate for temperature model and Int is a predetermined maximum value. An example of the update rate p is one every 1.5 min. In a case of Clk being p×Int, the switching controller 173 controls the temperature model update switch 169 to be connected to its terminal "a". In a case of Clk being not p×Int, the switching controller 173 controls the temperature model update switch 169 to be connected to its terminal "b".

The temperature signal 131 from the temperature sensor 129 of the OCXO 119 is fed to the temperature model calculator 165 and the turnover temperature logic unit 167. The turnover temperature logic unit 167 performs temperature calculation in accordance with the oscillator temperature and the IIRF filtered output to provide a turnover temperature signal 175 to the temperature model calculator 165. In response to the turnover temperature signal 175, the temperature model calculator 165 performs temperature model calculation in accordance with the IIRF filtered output and the oscillator temperature and provides a temperature model output signal 166 representing the updated temperature model output value.

The aging model output signal 154 from the aging characteristic processing unit 143 and the temperature model output signal 166 from the temperature characteristic processing unit 145 are fed to an adder 177 to provide an added signal 179. In response to the added signal 179, the voltage of the EFC input signal 118 applied to the OCXO 119 from the DAC 117 is controlled. The OCXO 119 performs oscillation in accordance with the EFC input signal 118, regardless the GPS-generated timing signal is available (in the GPS locked mode) and the GPS-generated timing signal is unavailable, when the base station loses contact with GPS satellite, i.e., the holdover period (the holdover mode).

Each of the aging model calculator 153 and the temperature characteristic processing unit 145 includes a Kalman filter. The Kalman filter includes a model of the characteristics and provides an error estimate amount as an output. The Kalman filter is known to those skilled in the art. It may comprise a model which performs state estimation, forecasting for oscillator characteristics of frequency aging and temperature. The Kalman filter provides internal estimates of the variances of each of the state estimates. The Kalman filter includes various algorithms necessary to perform prediction error analysis and to estimate the time, frequency, and frequency aging over an initial interval and then forecasts them into the future. The operation of Kalman filter is described in U.S. Pat. No. 5,144,595, which is incorporated herein by reference.

III. Operation in the GPS Locked Mode
(i) Aging Model Calculation

Figure 3:
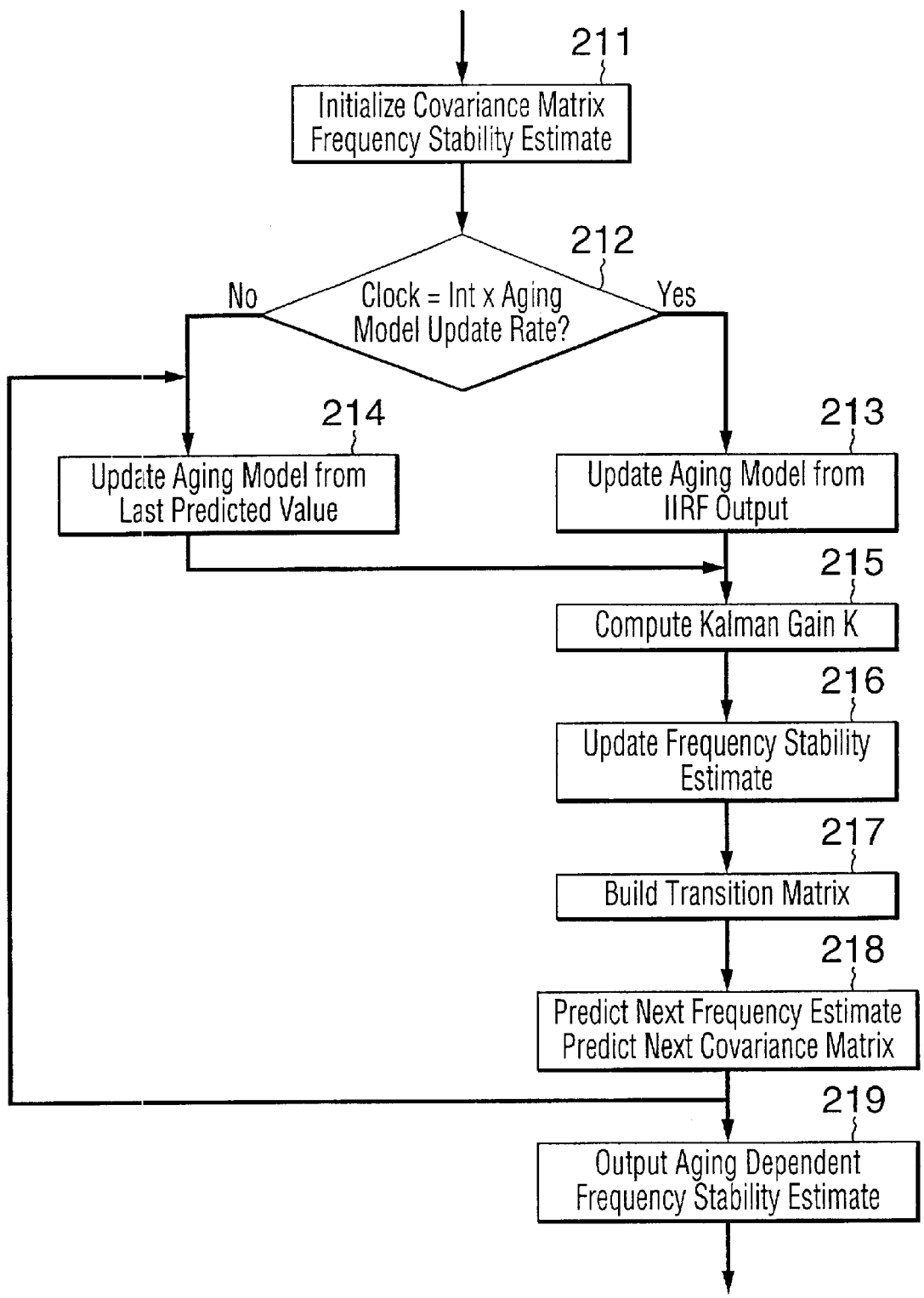
FIG. 3 is a flowchart showing the operation of an aging model calculator in the reference timing signal oscillator shown in FIG. 2.

When the GPS-generated timing signal is available, the PLL including the compensation processor 120 operates in the GPS locked mode and the aging model calculator 153 of the aging characteristic processing unit 143 performs aging dependency frequency stability calculation. FIG. 3 shows its operation. Referring to FIGS. 2 and 3, the GPS-holdover mode switch 157 of the aging characteristic processing unit 143 is connected to its terminal "a" for the GPS locked mode, in response to the mode switching signal 181. The aging model calculator 153 initializes its covariance matrix and frequency stability estimates (step 211). The covariance matrix captures the variance of the variants and the covariance of the variants. Variants in the embodiment are the frequency dependence on aging and frequency dependence on temperature. The variance of the variants is captured in the diagonal elements of the covariance matrix. The remaining elements of the matrix capture the covariant terms in the case where the variants are independent such as the present case and the covariant terms are zero.

The switching controller 159 determines whether the clock value Clk represented by the frequency count signal 147 is equal to m (the update rate for aging model)×the predetermined maximum value Int (step 212). If Clk is equal to m×Int (positive determination at step 212), the switching controller 159 controls the aging model update switch 155 to be connected to its terminal "a". The IIRF filtered output value from the IIRF 151 responding to the phase detect output signal 126 is fed to the aging model calculator 153 which in turn updates the aging model in accordance with the fed IIRF filtered value (step 213). Thus, it is updated by the raw input data measured based on the GPS-generated timing signal. If Clk is not equal to m×Int (negative determination at step 212), the switching controller 159 controls the aging model update switch 155 to be connected to its terminal "b". The aging model output signal 154 from the aging model calculator 153 is fed back to the aging model calculator 153 through the aging model update switch 155 and the GPS-holdover mode switch 157 and thus, the aging model is updated by the last (or the preceding) predicted value of that aging model (step 214). After the update of the aging model at step 213 or 214, the Kalman gain "K" is computed (step 215) and the frequency stability estimate is updated (step 216). The Kalman gain is calculated blending factor which determines the degree of emphasis to be placed on the next noisy measurement and the prior estimate of the measurement. The Kalman gain is this linear blending factor.

After the computation of the Kalman gain, a transition matrix is built (step 217). The following is an example of the transition matrix formulation for aging and temperature models.

$$A = \begin{bmatrix} 1 & V_t \cdot \Delta t & a_t \cdot \frac{\Delta t^2}{2} & 0 & 0 & 0 \\ 0 & 1 & V_t \cdot \Delta t & 0 & 0 & 0 \\ 0 & 0 & 1 & 0 & 0 & 0 \\ 0 & 0 & 0 & 1 & V_T \cdot \Delta T & a_T \cdot \frac{\Delta T^2}{2} \\ 0 & 0 & 0 & 0 & 1 & V_T \cdot \Delta T \\ 0 & 0 & 0 & 0 & 0 & 1 \end{bmatrix}$$

where:

$\Delta t$ is a time step;

$\Delta T$ is a temperature step;

$V_t$ is a weighting term on the first derivative aging dependent model;

$a_t$ is a weighting term on the second derivative aging dependent model;

$V_T$ is a weighting term on the first derivative temperature dependent model; and $a_T$ is a weighting term on the second derivative temperature dependent model.

It is noted that the transition matrix may be expanded to include higher order non linearity terms $\Delta t^3$, $\Delta t^4$ . . . However, in this embodiment, the aging and temperature dependent characteristics of the OCXO are well modeled by linear dependencies with appropriate weighting functions.

The transition matrix contains the state update equations which when applied to the current state generate the next predicted state. The next frequency estimate and the next covariance matrix are predicted (step 218). After step 218 is performed, steps 214–218 are repeated. In accordance with the predicted frequency estimate and covariance matrix, the aging dependent frequency estimate is provided by the aging model calculator 153 of the aging characteristic processing unit 143 (step 219).

(ii) Temperature Model Calculation

Figure 4:
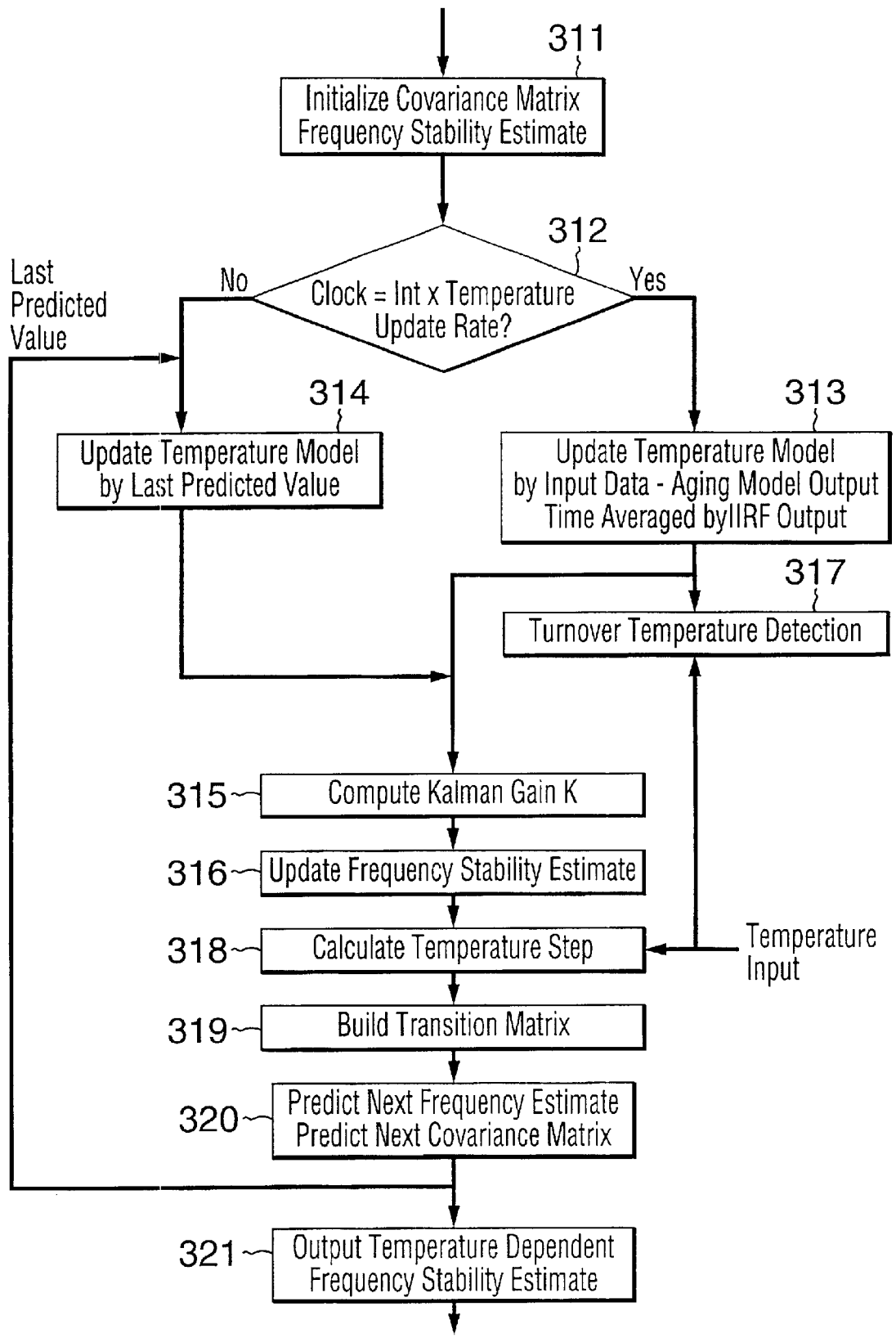
FIG. 4 is a flowchart showing the operation of the temperature model calculator in the reference timing signal oscillator shown in FIG. 2.

In the GPS locked mode, the temperature model calculator 165 of the temperature characteristic processing unit 145 performs temperature dependent frequency stability calculation. FIG. 4 shows its operation. Referring to FIGS. 2 and 4, the GPS-holdover mode switch 171 of the temperature characteristic processing unit 145 is connected to its terminal "a" for the GPS locked mode, in response to the mode switching signal 181. The temperature model calculator 165 initializes the covariance matrix and the frequency stability estimate (step 311). The switching controller 173 determines whether the clock value Clk represented by the frequency count signal 147 is equal to p (the update rate for temperature model)×the predetermined maximum value Int. If Clk=pxInt (positive determination at step 312), the switching controller 173 controls the temperature model update switch 169 to be connected to its terminal "a". The subtractor 161 subtracts the aging model output of the aging model output signal 154 from the raw input data represented by the phase detect output signal 126. The subtracted data represented by the subtracted signal 162 is filtered by the IIRF 163. The IIRF filtered output data is fed to the temperature model calculator 165. The temperature model calculator 165 updates the temperature model in accordance with the subtracted data and averages time of the subtracted data (step 313).

If Clk is not pxInt (negative determination at step 312), the switching controller 173 controls the temperature model update switch 169 to be connected to its terminal "b". The temperature model output signal 166 of the temperature model calculator 165 is fed back to the input of the temperature model calculator 165. Thus, the temperature model calculator 165 updates the temperature model by the last (or the preceding) predicted value (step 314). After performing step 313 or step 314, the temperature model calculator 165 computes the Kalman gain K (step 315) and the frequency stability estimate is calculated (step 316).

The sensed temperature relating to the OCXO 119 is provided to the temperature model calculator 165 and the turnover temperature logic unit 167 by the temperature signal 131. The turnover temperature logic unit 167 calculates or detects the turnover temperature, in accordance with the IIRF filtered value, the averaged time calculated at step 313 and the sensed temperature (step 317). The calculated turnover temperature is provided to the temperature model calculator 165 from the turnover temperature logic unit 167. The temperature model calculator 165 calculates the temperature step AT (step 318). In accordance with the calculated turnover temperature, the temperature step and the IIRF filtered value, the temperature model calculator 165 updates the temperature model thereof. Thus, the transition matrix is built (step 319) and next frequency estimate and next covariance matrix are predicted (step 320). The transition matrix is shown above as the transition matrix formulation A. Then, step 314–320 are repeated. After step 320, the updated temperature model output is provided by the temperature model calculator 165 as the temperature model output signal 166. The temperature model output signal 166 represents the output temperature dependent frequency stability estimate (step 321).

The aging model output signal 154 and the temperature model output signal 166 are fed to the adder 177 to be added to provide the added signal 179. In response to the added signal 179, the DAC 117 provides the EFC input signal 118 in accordance with the output aging dependent frequency stability estimate and the output temperature dependency frequency stability estimate. Thus, the OCXO 119 is controlled by both the aging and temperature dependent frequency estimates.

(iii) Turnover Temperature Detection

Figure 5:
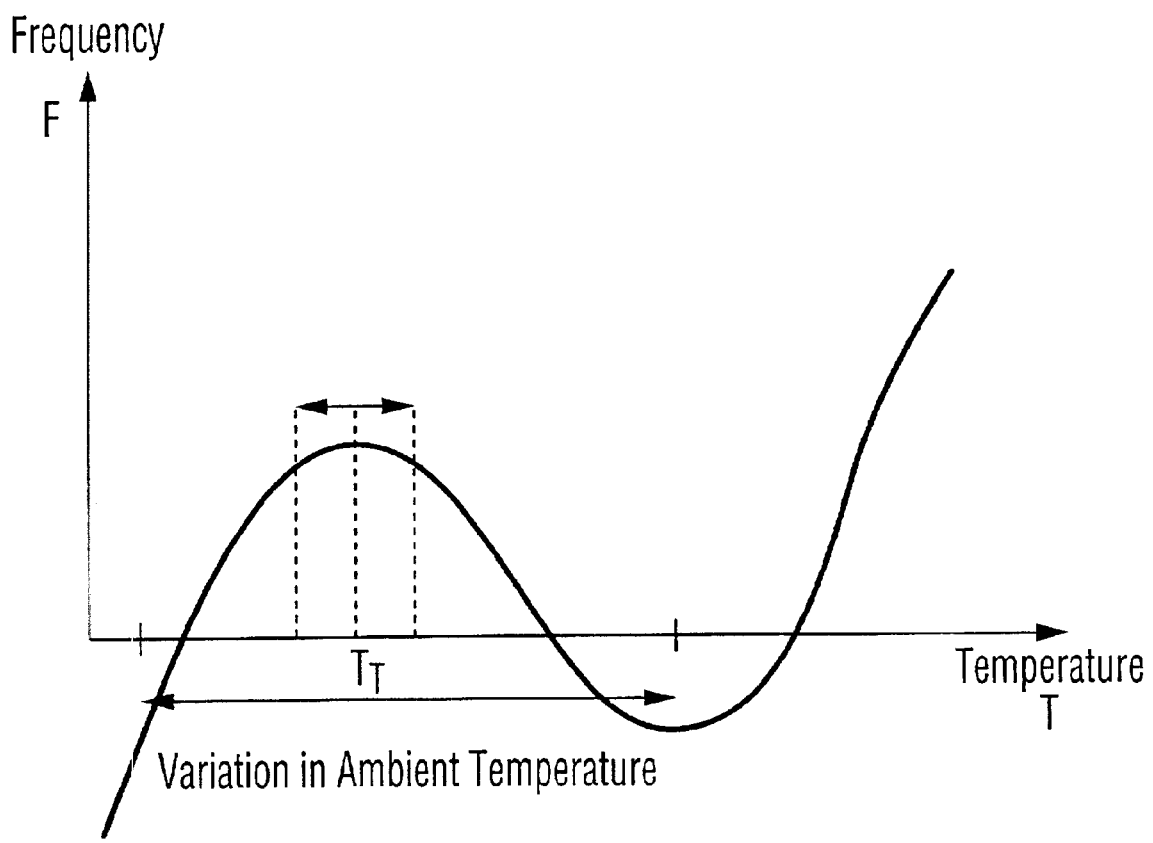
FIG. 5 depicts a form of the frequency (F) vs. temperature (T) characteristic for an SC cut crystal used in an oscillator included in the reference timing signal oscillator shown in FIG. 2.

In a case where the OCXO 119 uses an SC cut crystal, the form of its frequency (F) vs. temperature (T) characteristic is taken as shown in FIG. 5. The form of the F-T characteristic is taken in the temperature range experienced by a crystal due to ovenization. As the turnover temperature $T_T$ is passed the dF/dT slope changes sign (from + to − or from − to +). It is necessary to detect such a distinction of the temperature characteristic as the turnover temperature and then apply it to the transition matrix of the Kalman filter to ensure the Kalman filter gradient dF/dt changes sign. It is noted that dF/dT is the rate of change in frequency with temperature and dF/dt is the rate of change in frequency with time.

Figure 6:
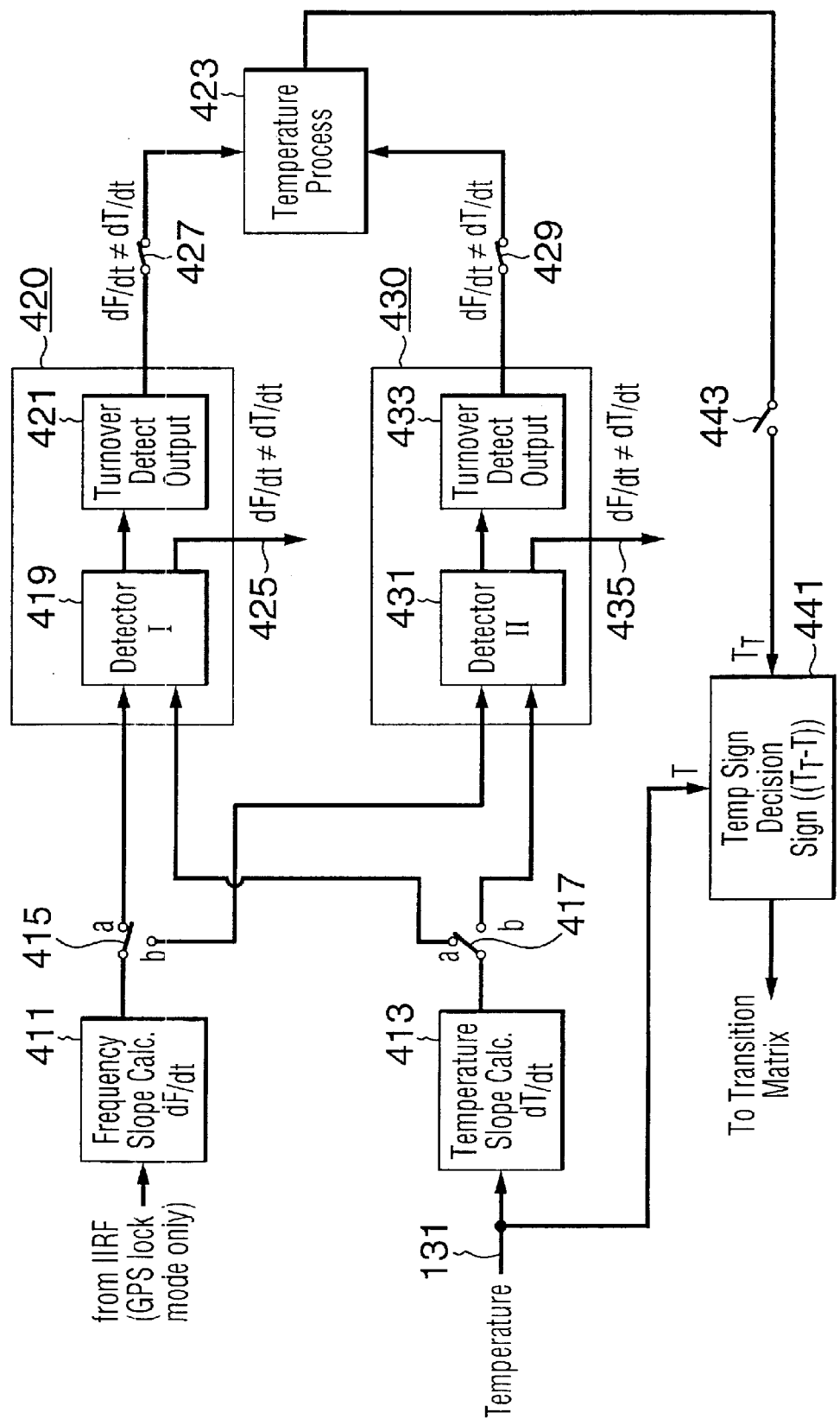
FIG. 6 shows a detail of a turnover temperature calculation unit included in the reference timing signal oscillator shown in FIG. 2.
Figure 7:
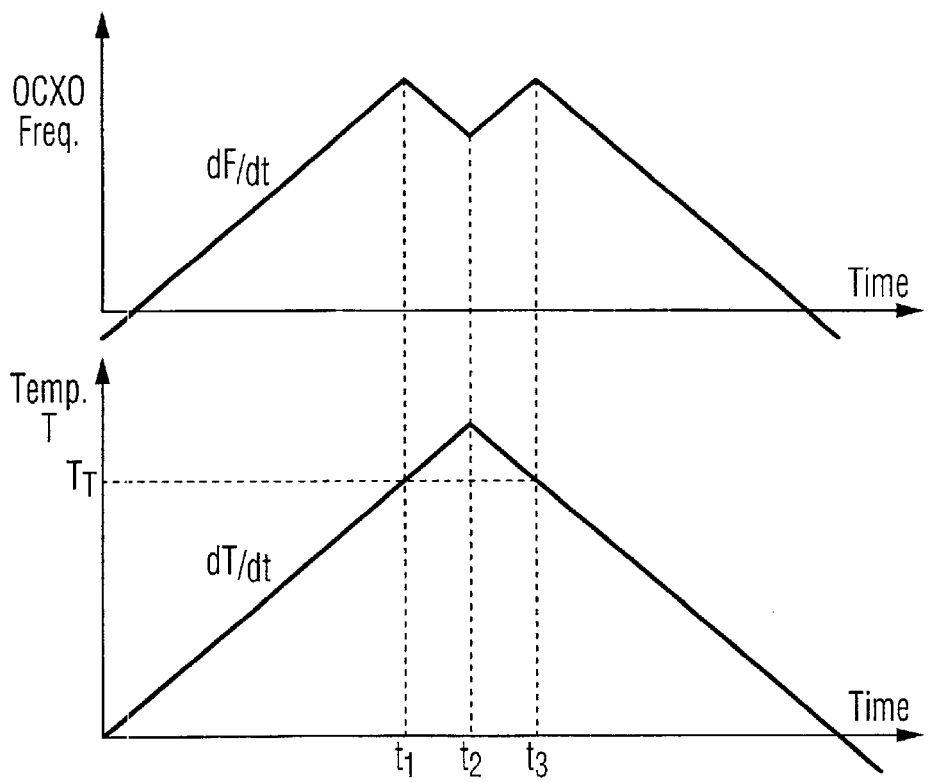
FIG. 7 shows the characteristic of the rates dF/dt and dT/dt for detecting the turnover temperature in the GPS locked mode.

FIG. 6 shows the turnover temperature logic unit 167 shown in FIG. 2. FIG. 7 shows the characteristic of the rates dF/dt and dT/dt for detecting the turnover temperature in the GPS locked mode. Referring to FIGS. 2, 6 and 7, the IIRF filtered value from the IIRF 163 is fed to a frequency slope calculator 411 in the GPS locked mode only to calculate a frequency slope dF/dt. The sensed temperature (T) represented by the temperature signal 131 is provided to a temperature slope calculator 413 to calculate a temperature slope dT/dt. When a detector selection switch 415 and another detector selection switch 417 are connected to their terminals "a", the frequency slope dF/dt and the temperature slope dT/dt are provided to a slope detector 419 of a turnover detector 420. If the sign of dF/dt is equal to the sign of dT/dt, no turnover temperature will be detected (e.g., prior to time $t_1$ as shown in FIG. 7). If the sign of dF/dt is not equal to the sign of dT/dt, a turnover temperature $T_T$ will be detected (e.g., between times $t_1$ and $t_2$, between times $t_2$ and $t_3$). A detection output unit 421 provides a turnover signal to a temperature processor 423 through a GPS locked mode switch 427. The GPS locked mode switch 427 is on (closed) in the GPS locked mode only. The slope detector 419 provides an activation signal 425.

In response to the activation signal 425, the detector selection switch 415 and the detector selection switch 417 switch their connections to their terminals "b" to activate a turnover detector 430. The outputs dF/dt and dT/dt from the frequency slope calculator 411 and the temperature slope calculator 413 are fed to a slope detector 431 of the turnover detector 430. If the sign of dF/dt is equal to the sign of dT/dt, the turnover temperature $T_T$ will be detected. A turnover detection output unit 433 provides a turnover signal to the temperature processor 423 through a GPS locked mode switch 429. The GPS locked mode switch 429 is on (closed) in the GPS locked mode only. The slope detector 431 provides an activation signal 435.

In response to the turnover signals from the turnover detection output unit 421 and the turnover detection output unit 433, the temperature processor 423 holds the input temperature in variable turnover temperature and in moving average filter. In response to the activation signal 435, the detector selection switch 415 and the detector selection switch 417 switch their connections to their terminals "a" to activate the turnover detector 420.

A holdover mode switch 443 is on (closed) in the holdover mode only and thus, no temperature processed signal from the temperature processor 423 is provided to a temperature sign detector 441 in the GPS locked mode. In accordance with the temperature T, the temperature sign detector 441 detects the temperature sign $S_T$ and provides it to the temperature model calculator 165. The sign $S_T$ is used to build the transition matrix of the temperature model by the temperature model calculator 165 (step 319 in FIG. 4).

IV. Holdover Mode Operation

Referring to FIG. 2, when the base station loses contact with GPS satellite, the GPS-generated timing signal is unavailable to the PLL and the compensation processor 120. The PLL needs to operate in the holdover mode during the period of lacking of the GPS-generated timing signal, so as to provide the base station reference timing signal 127. In the holdover mode, the OCXO 119 operates as a self-oscillator, the frequency of which is controlled by the steering voltage, in accordance with the characteristics of the aging and temperature models of the Kalman filters. In the holdover mode, the GPS-holdover mode switch 157 of the aging characteristic processing unit 143 and the GPS-holdover mode switch 171 of the temperature characteristic processing unit 145 are connected to their terminals "b". The aging model output signal 154 of the aging model calculator 153 is fed back to its input terminal through the GPS-holdover mode switch 157 and the temperature model output signal 166 is fed back to its input terminal through the GPS-holdover mode switch 171. The GPS locked mode switches 427 and 429 are off (open) and thus, the temperature processor 423 does not perform new processing. The holdover mode switch 443 (shown in FIG. 6) of the turnover temperature logic unit 167 is on (closed) and thus, temperature processed signal from the temperature processor 423 is provided to the temperature sign detector 441 which provides an output sign $S_T$ to the temperature model calculator 165, in accordance with the temperature processed signal from the temperature processor 423 and the temperature T. The sign $S_T$ is used to build the transition matrix of the temperature model by the temperature model calculator 165.

(i) Aging Dependent Frequency Stability Calculation

Figure 8:
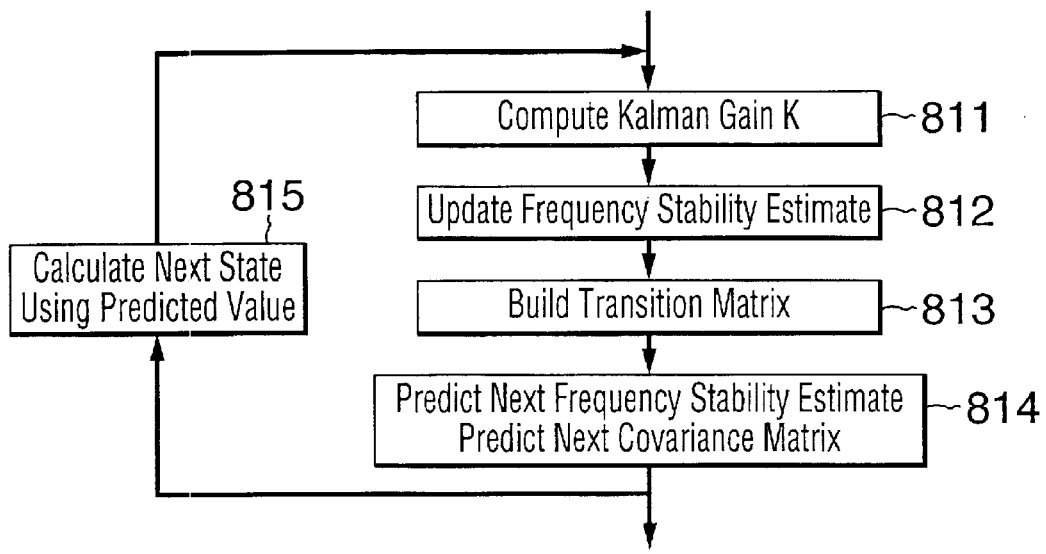
FIG. 8 is a flowchart showing the operation of the aging dependent frequency stability calculator in the holdover mode.

FIG. 8 shows the aging dependent frequency stability calculation in the holdover mode. The aging model calculator 153 of the aging characteristic processing unit 143 uses covariance matrix and frequency stability estimates predicted by using the adaptive algorithm. Prior to the hold over mode, the aging model calculator 153 of the aging characteristic processing unit 143 set its covariance matrix and frequency stability estimates, in the GPS locked mode.

Referring to FIGS. 8 and 2, the aging model calculator 153 computes the Kalman gain K (step 811). The frequency stability estimate is updated (step 812). The transition matrix is built (step 813). The transition matrix is shown above as the transition matrix formulation A. The transition matrix contains the state update equations which when applied to the current state generate the next predicted state. The next frequency stability estimate and next covariance matrix are predicted (step 814). Next state is calculated using the predicted values (step 815) and steps 811–814 are repeated. In accordance with the predicted next frequency stability estimate and covariance matrix, the aging dependent frequency estimate is provided by the aging model calculator 153. Thus, the aging model calculator 153 uses the predicted covariance matrix and frequency stability estimates obtained in step 814. The aging dependent frequency estimate is represented by the aging model output signal 154 from the aging characteristic processing unit 143.

(ii) Temperature Dependent Frequency Stability Calculation

Figure 9:
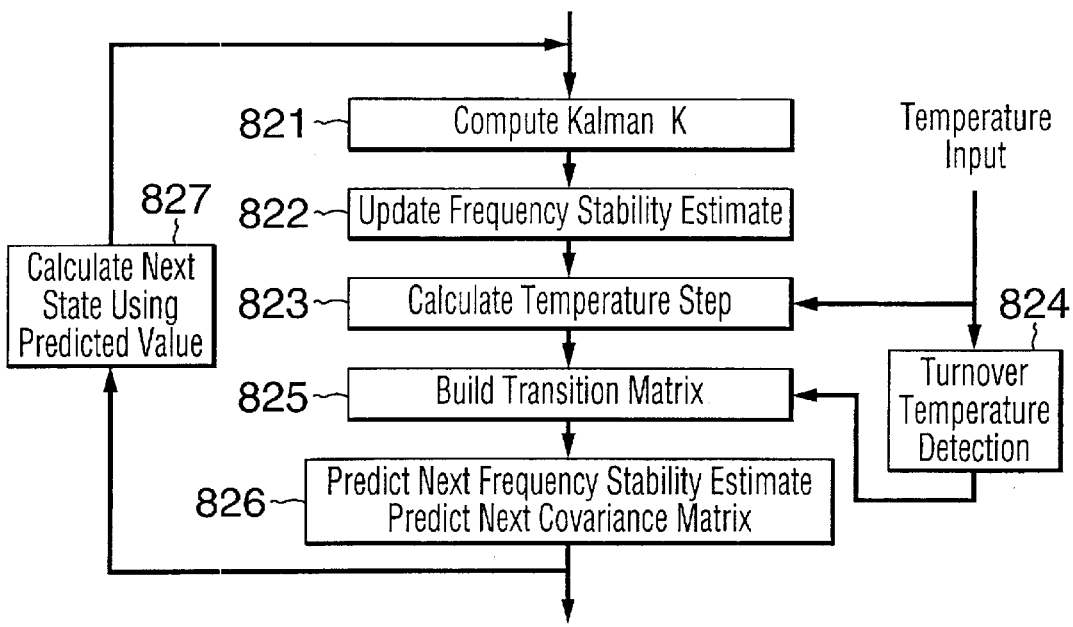
FIG. 9 is a flowchart showing the operation of the temperature dependent frequency stability calculator in the holdover mode.

FIG. 9 shows the temperature dependent frequency stability calculation in the holdover mode. The temperature model calculator 165 of the temperature characteristic processing unit 145 uses covariance matrix and frequency stability estimate predicted by using the adaptive algorithm. Prior to the hold over mode, the temperature model calculator 165 of the temperature characteristic processing unit 145 set its covariance matrix and frequency stability estimates, in the GPS locked mode.

Referring to FIGS. 9 and 2, the temperature model calculator 165 computes the Kalman gain K (step 821). The frequency stability estimate is updated (step 822). The sensed temperature from the temperature sensor 129 is fed to the temperature model calculator 165 by the temperature signal 131. The temperature model calculator 165 calculates the temperature step ΔT (step 823). In accordance with the temperature T, the turnover temperature logic unit 167 calculates or detects the turnover temperature $T_T$ (step 824). The holdover mode switch 443 shown in FIG. 6 is on in the holdover mode and the turnover temperature $T_T$ is provided from the temperature processor 423 to the temperature sign detector 441. The temperature sign detector 441 determines the sign of the difference between the turnover temperature $T_T$ and the sensed temperature T, ($T_T$–T), and the weighting term $V_T$ is detected thereby. In response to the calculated temperature and the turnover temperature detection, the temperature model calculator 165 builds the transition matrix (step 825) and applies the sign detected by the temperature sign detector 441 to the weighting factor $V_T$ in the temperature model by multiplying $V_T$ by the turnover temperature sign. Next frequency stability estimate and next covariance matrix are predicted (step 826). Thereafter, the next state is calculated using the predicted values (step 827) and steps 821–826 are repeated. After step 826 is performed, the temperature dependent frequency estimate is provided. Thus, the temperature model calculator 165 uses the predicted covariance matrix and frequency stability estimate obtained in step 826. In accordance with the predicted next frequency stability estimate and covariance matrix, the temperature dependent frequency estimate is provided by the temperature model calculator 165.

The aging dependent frequency estimate represented by the aging model output signal 154 from the aging characteristic processing unit 143 and the temperature dependent frequency estimate represented by the temperature model output signal 166 from the temperature characteristic processing unit 145 are fed to the adder 177. The added signal 179 from the adder 177 includes both the aging and temperature dependent estimates which are provided to the DAC 117 to control the frequency of the OCXO 119. Thus, the predicted frequency values generated in accordance with the updated model provide the necessary reference for compensation of the OCXO 119. In the holdover mode, temperature input values are continuously available to the compensation algorithm and it self-propagates the temperature model to be updated. The updated model is highly accurate as a result of the frequency updates even during the holdover period.

V. Another Embodiment

Figure 10:
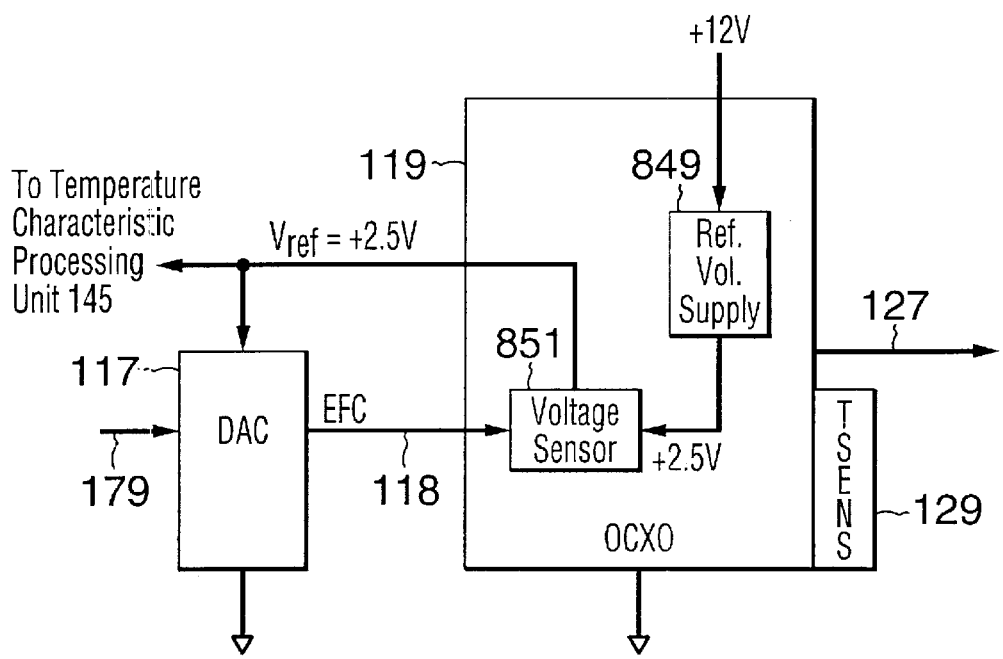
FIG. 10 is a block diagram which depicts a voltage sensor in an oven-controlled crystal oscillator (OCXO) for providing a reference voltage to a digital-to-analog converter (DAC) shown in FIG. 2.

Another element of the frequency dependent stability is the power supply voltage of the OCXO 119. FIG. 10 shows the OCXO 119 for providing a reference voltage to the DAC 117. In FIG. 10, a supply voltage (e.g., +12 volts) is provided to the OCXO 119 for its operation. A reference voltage supply unit 849 included in the OCXO 119 provides an ovenized voltage (e.g., +2.5 volts) which is sensed by a voltage sensor 851 which in turn provides an ovenized reference voltage $V_{ref}$ to the DAC 117. This reference voltage $V_{ref}$ is fed to the temperature model calculator 165 of the temperature characteristic processing unit 145 shown in FIG. 2. The temperature model calculator 165 calculates the temperature model in accordance with the voltage, among others. Thus, the frequency stability is achieved against the variation of the power supply voltage over time.

Figure 11:
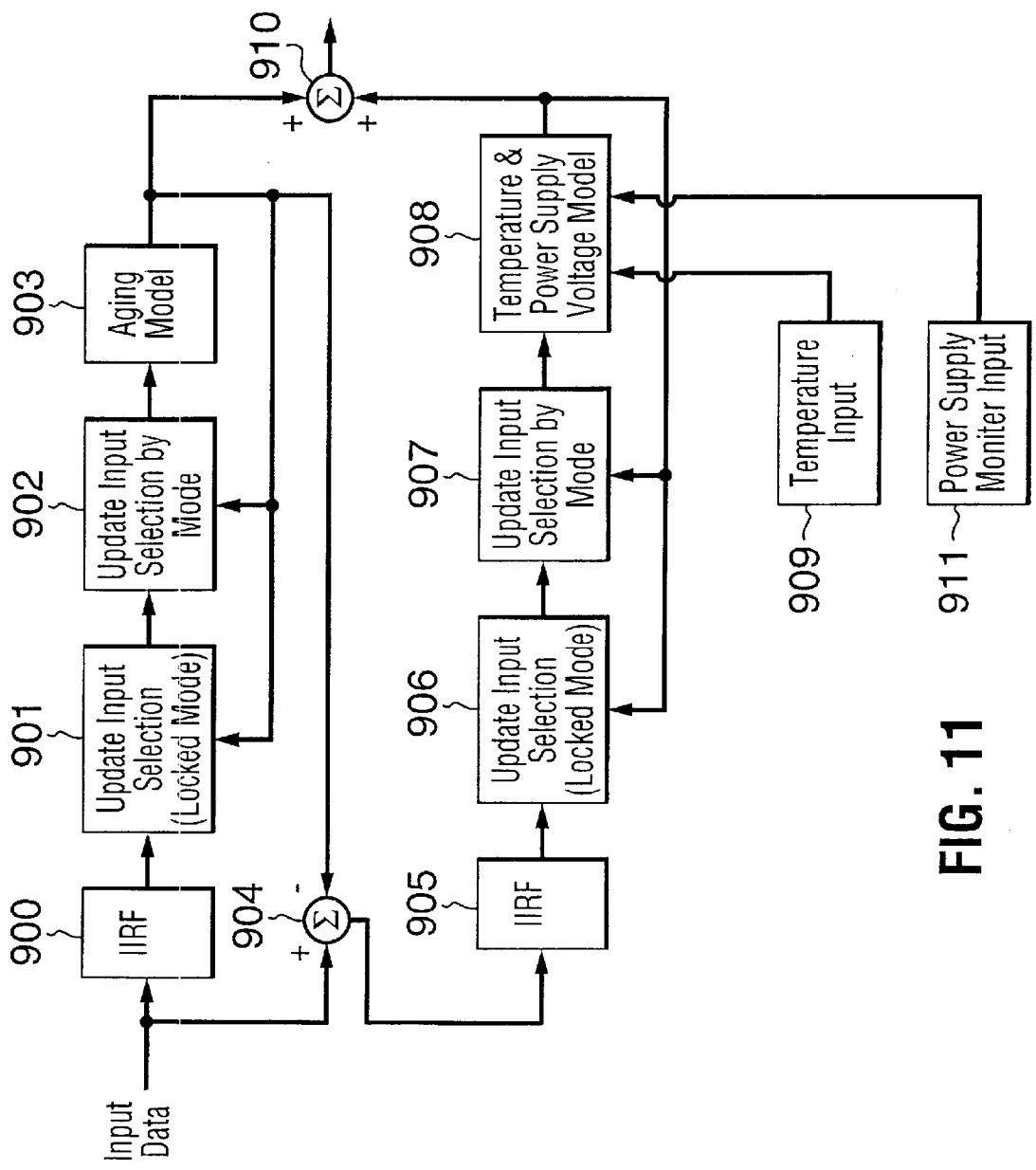
FIG. 11 illustrates the function of another embodiment according to the present invention.

FIG. 11 illustrates the function of another embodiment according to the present invention, wherein the frequency dependent stability of power supply voltage is implemented. The function of each block shown in FIG. 11 corresponds to that of each of block and unit shown in FIGS. 2, 6 and 10.

Referring to FIG. 11, a raw input data of the frequency of an oscillator (not shown) is fed to an IIRF 900 which in turn provides its IIRF filtered output data to a locked mode input selector 901. The locked mode input selector 901 selects update input data and its selected data is fed to a GPS-holdover input selector 902 which provides selected data, in accordance with a mode, to an aging model calculator 903. In the GPS locked mode, the data selected by the locked mode input selector 901 is fed to the aging model calculator 903. The aging model calculator 903 calculates Kalman filter function values in accordance with the input data and updates an aging model thereof, so that the future frequency state of the oscillator is predicted from the updated model. The aging model relates to the aging characteristic of the oscillator. In accordance with the updated model, output data is fed from the output of the aging model calculator 903 to the locked mode input selector 901 and the GPS-holdover input selector 902. In the event that the aging model needs to be periodically updated by its preceding state, the locked mode input selector 901 selects the output data of the aging model calculator 903 as an input data, so that the output data is fed back to the input of the aging model calculator 903. Accordingly, the aging model is updated by the preceding state. In the holdover mode, the input data is unavailable and the GPS-holdover input selector 902 selects the output data of the aging model calculator 903 and feeds back it to the input thereof, so that the aging model of the aging model calculator 903 is updated in accordance with its preceding state in the holdover period.

The input data is subtracted by the output data of the aging model calculator 903 in a subtractor 904 and the subtracted data is fed to an IIRF 905. The IIRF filtered output data is fed to a locked mode input selector 906. The locked mode input selector 906 selects update input data and its selected data is fed to a GPS-holdover input selector 907 which provides selected data, in accordance with a mode, to a temperature model calculator 908. In the GPS locked mode, the data selected by the locked mode input selector 906 is fed to is fed to the temperature model calculator 908. Also, a temperature sensor 909 provides the temperature model calculator 908 with a temperature input data that is in relation to the oscillator and a power supply voltage sensor 911 provides the temperature model calculator 908 with a power supply monitor input. The temperature model calculator 908 calculates Kalman filter function values in accordance with the input data, the temperature input and the power supply voltage input and updates a temperature model thereof, so that the future frequency state of the oscillator is predicted from the updated model. The temperature model relates the temperature characteristic of the oscillator. In accordance with the updated model, output data is fed from the output of the temperature model calculator 908 to the locked mode input selector 906 and the GPS-holdover input selector 907. In the event that the temperature needs to be periodically updated by its preceding state, the locked mode input selector 906 selects the output data of the temperature model calculator 908 as an input data, so that the output data is fed back to the input of the temperature model calculator 908. The temperature model is updated by the preceding state. In the holdover mode, the input data is unavailable and the GPS-holdover input selector 907 selects the output data of the temperature model calculator 908 and feeds it back to the input thereof, so that the temperature model of the temperature model calculator 908 is updated in accordance with the preceding state in the holdover period.

The output data of the aging model calculator 903 and the temperature model calculator 908 is fed to an adder 910 which in turn provides added data. The added data represents predicted frequency element in accordance with the aging, temperature and voltage characteristics. The predicted frequency dependent element is provided the oscillator, so that the oscillator changes its oscillation frequency in accordance with the predicted frequency element, regardless of the GPS locked mode or the holdover mode. Therefore, the oscillation frequency is controlled in accordance with the models' elements updated by input data in the GPS-mode (a training period) and with the models' elements in the holdover mode, the elements having been updated in the training period.

The algorithm is extendable to any number of frequency perturbing variables. The algorithm can automatically determine the turnover temperature of the crystal oscillator and use this information to enhance tracking during holdover mode. Robust controller tolerance is achieved to variations in oscillator performance. The algorithm is adaptive to any drift pattern. There is no maintenance cost for the embedded algorithm. The algorithm model adaptively scales the order of the control model. Using the algorithm causes cost reduction in processors and memories.

VI. Others

In the above embodiment, the oscillator is the double ovened one and a Kalman filter is used as an adaptive filter in the aging and temperature models for updating their function elements to compensate the frequency dependency characteristics. However, a crystal oscillator without oven-control may be used as an oscillator. Other type of filters, predictors and compensation models may be used. An example of other adaptive filters is an h-infinite filter which may be used for the adaptive algorithm of the aging model calculator and the temperature model calculator 108, wherein the calculators calculate their filter function values. The PLL may be applicable to any apparatus other than mobile base stations. The algorithm in the embodiments focused on the aging, temperature and voltage frequency dependent characteristics. However, there are other characteristics causing the long term perturbation of the frequency of oscillators.

Although particular embodiments of the present invention have been described in detail, there are numerous variations. It should be appreciated that numerous variations, modifications, and adaptations may be made without departing from the scope of the present invention as defined in the claims.

What is claimed is:

1. A phase-locked loop (PLL) for providing a timing output signal, the PLL comprising:
   an oscillator for generating an oscillation output signal in response to a control component of an input control signal;
   a difference detector for detecting a difference between the oscillation output signal and an input reference timing signal when the input reference timing signal is available, thereby providing a difference signal; and
   a processor for varying the control component of the input control signal applied to the oscillator in accordance with the difference detected by the difference detector and a frequency dependent element relating to the oscillator, the frequency dependent element being provided in accordance with a characteristic model that is updateable in accordance with the difference signal provided by the difference detector when the input reference timing signal is available, a frequency of the oscillation output signal generated by the oscillator being controlled in accordance with the varied control component of the input control signal.

2. The PLL of claim 1, wherein the processor comprises:
   a processing unit for updating a parameter of the characteristic model, the parameter being changed in accordance with the e difference signal when the input reference timing signal is available and in accordance with a past parameter when the input reference timing signal is unavailable, respectively, and for providing a characteristic signal in accordance with the updated parameter of the characteristic model, the control component of the input control signal being varied in accordance with the characteristic signal.

3. The PLL of claim 2, wherein the processing unit comprises:
   a first processing unit for providing a first characteristic signal included in the characteristic signal in accordance with a first parameter of a first model included in the characteristic model, the first parameter being relating to an aging characteristic of the oscillator, the first processing unit updating the first parameter in accordance with the difference signal when the input reference timing signal is available and in accordance with a past parameter when the input reference timing signal is unavailable, respectively.

4. The PLL of claim 3, the first processing unit further comprising:
   a first update determiner for determining whether the first parameter is updated regardless of the availability of the input reference timing signal, the determination being made in accordance with a predetermined period, wherein the first processing unit updates the first parameter in accordance with a past parameter.

5. The PLL of claim 3, the processing unit further comprising:
   a second processing unit for providing a second characteristic signal included in the characteristic signal in accordance with a second parameter of a second model of the characteristic model, the second parameter being relating to a temperature characteristic of the oscillator, the second processing unit updating the second parameter in accordance with the difference signal and a temperature in relation to the oscillator when the input reference timing signal is available, the second processing unit updating the second parameter in accordance with a past parameter when the input reference timing signal is unavailable,
   wherein the first and second characteristic signals are combined to produce the characteristic signal, so as to vary the control component of the input control signal.

6. The PLL of claim 5, the second processing unit further comprising:
   a second update determiner for determining whether the second parameter is updated regardless of the availability of the input reference timing signal, the determination being made in accordance with a predetermined period, wherein the second processing unit updates the second parameter in accordance with a past parameter.

7. The PLL of claim 5, the second processing unit comprising:
   an update distinction detector for detecting a distinction of the second parameter in accordance with the frequency of the oscillation output signal and the temperature in relation to the oscillator, the second parameter being positively or negatively updated in accordance with the detected distinction.

8. The PLL of claim 3, the processing unit further comprising:
   a second processing unit for providing a second characteristic signal included in the characteristic signal in accordance with a second parameter of a second model of the characteristic model, the second parameter being relating to a temperature characteristic of the oscillator, the second processing unit updating the second parameter in accordance with the first characteristic signal provided by the first processing unit and a temperature in relation to the oscillator when the input reference timing signal is available, the second processing unit updating the second parameter in accordance with a past parameter when the input reference timing signal is unavailable, wherein the first and second characteristic signals are combined to produce the characteristic signal, so as to vary the control component of the input control signal.

9. The PLL of claim 8, wherein:

the first processing unit further comprises a first update determinater for determining whether the fist parameter is updated regardless of the availability of the input reference timing signal, the determination being made in accordance with a predetermined period, wherein the first processing unit updates the first parameter in accordance with a past parameter; and the second processing unit further comprises a second update determinater for determining whether the second parameter is updated regardless of the availability of the input reference timing signal, the determination being made in accordance with a predetermined period, wherein the second processing unit updates the second parameter in accordance with a past parameter.

10. The PLL of claim 8, the second processing unit comprising:

an update distinction detector for detecting a distinction of the second parameter in accordance with the frequency of the oscillation output signal and the temperature in relation to the oscillator, the second parameter being positively or negatively updated in accordance with the detected distinction.

11. The PLL of claim 2, wherein the processing unit comprises:

a first processing unit for providing a first characteristic signal included in the characteristic signal in accordance with a first parameter of a first model included in the characteristic model, the first parameter being relating to an aging characteristic of the oscillator, the first processing unit updating the first parameter in accordance with the difference signal when the input reference timing signal is available and in accordance with a past parameter when the input reference timing signal is unavailable, respectively; and a second processing unit for providing a second characteristic signal included in the characteristic signal in accordance with a second parameter of a second model of the characteristic model, the second parameter being relating to a temperature characteristic of the oscillator, the second processing unit updating the second parameter (i) in accordance with the difference signal, the first characteristic signal provided by the first processing unit and a temperature in relation to the oscillator, when the input reference timing signal is available; and (ii) in accordance with a past parameter when the input reference timing signal is unavailable, wherein the first and second characteristic signals are combined to produce the characteristic signal, so as to vary the control component of the input control signal.

12. The PLL of claim 11, wherein the processing unit comprises:

each of the first and second first processing units comprises an adaptive filter, the first processing unit updating the first parameter of the first model using the adaptive filter thereof, the second processing unit updating the second parameter of the second model using the adaptive filter thereof.

13. The PLL of claim 11, wherein:

the first processing unit further comprises a first update determinater for determining whether the fist parameter is updated regardless of the availability of the input reference timing signal, the determination being made in accordance with a predetermined period, wherein the first processing unit updates the first parameter in accordance with a past parameter; and the second processing unit further comprises a second update determinater for determining whether the second parameter is updated regardless of the availability of the input reference timing signal, the determination being made in accordance with a predetermined period, wherein the second processing unit updates the second parameter in accordance with a past parameter.

14. The PLL of claim 11, further comprising:

a temperature sensor for sensing temperature in relation to the oscillator to provide the temperature signal.

15. The PLL of claim 11, the second processing unit comprising:

an update distinction detector for detecting a distinction of the second parameter in accordance with the frequency of the oscillation output signal and the temperature in relation to the oscillator, the second parameter being positively or negatively updated in accordance with the detected distinction.

16. The PLL of claim 2, wherein the processing unit comprises:

a first processing unit for providing a first characteristic signal included in the characteristic signal in accordance with a first parameter of a first model included in the characteristic model, the first parameter being relating to an aging characteristic of the oscillator, the first processing unit updating the first parameter in accordance with the difference signal when the input reference timing signal is available and in accordance with a past parameter when the input reference timing signal is unavailable, respectively; and a second processing unit for providing a second characteristic signal included in the characteristic signal in accordance with a second parameter of a second model of the characteristic model, the second parameter being relating to a temperature characteristic of the oscillator, the second processing unit updating the second parameter (i) in accordance with the difference signal, the first characteristic signal provided by the first processing unit, a temperature in relation to the oscillator and a voltage in relation to the oscillator, when the input reference timing signal is available; and (ii) in accordance with a past parameter when the input reference timing signal is unavailable, wherein the first and second characteristic signals are combined to produce the characteristic signal, so as to vary the control component of the input control signal.

17. The PLL of claim 16, wherein the processing unit comprises:

each of the first and second first processing units comprises an adaptive filter, the first processing unit updating the first parameter of the first model using the adaptive filter thereof, the second processing unit updating the second parameter of the second model using the adaptive filter thereof.

18. The PLL of claim 16, wherein:
the first processing unit further comprises a first update determinater for determining whether the fist parameter is updated regardless of the availability of the input reference timing signal, the determination being made in accordance with a predetermined period, wherein the first processing unit updates the first parameter in accordance with a past parameter; and
the second processing unit further comprises a second update determinater for determining whether the second parameter is updated regardless of the availability of the input reference timing signal, the determination being made in accordance with a predetermined period, wherein the second processing unit updates the second parameter in accordance with a past parameter.

19. The PLL of claim 16, further comprising:
a temperature sensor for sensing temperature in relation to the oscillator to provide the temperature signal to the second processing unit; and
a voltage detector for detecting voltage in relation to the oscillator to provide the voltage signal to the second processing unit.

20. The PLL of claim 16, the second processing unit comprising:
an update distinction detector for detecting a distinction of the second parameter in accordance with the frequency of the oscillation output signal and the temperature in relation to the oscillator, the second parameter being positively or negatively updated in accordance with the detected distinction.

21. The PLL of claim 1, further comprising:
a converter for converting the updated frequency dependent element into voltage representing the control component of the input control signal applied to the oscillator.

22. A method for providing an accurate timing output signal when an input reference timing signal is unavailable, the method comprising the steps of:
providing an oscillator for generating an oscillation output signal in response to a control component of an input control signal;
detecting a difference between the oscillation output signal and an input reference timing signal when the input reference timing signal is available, thereby providing a difference signal;
changing the control component of the input control signal applied to the oscillator in accordance with the difference detected by the difference detector and a frequency dependent element relating to the oscillator;
providing the frequency dependent element in accordance with a characteristic model that is updateable in accordance with the difference signal when the input reference timing signal is available,
wherein a frequency of the oscillation output signal generated by the oscillator is controlled in accordance with the varied control component of the input control signal, the timing output signal being provided in accordance with the oscillation output signal.

23. The method of claim 22, wherein the step of providing the oscillation characteristic comprises the step of:
providing a first characteristic signal in accordance with a first parameter of a first model, the first parameter being relating to an aging characteristic of the oscillator;
updating the first parameter in accordance with the difference signal when the input reference timing signal is available and in accordance with a past parameter when the input reference timing signal is unavailable, respectively;
providing a second characteristic signal included in accordance with a second parameter of a second model, the second parameter being relating to a temperature characteristic of the oscillator;
updating the second parameter:
(i) in accordance with the difference signal, the first characteristic signal provided by the first processing unit and a temperature in relation to the oscillator, when the input reference timing signal is available;
(ii) in accordance with a past parameter when the input reference timing signal is unavailable; and
combining the first and second characteristic signals to produce the characteristic signal, so as to vary the control component of the input control signal.

24. The method of claim 23, wherein the step of updating the second parameter comprises the step of:
detecting a distinction of the second parameter in accordance with the frequency of the oscillation output signal and the temperature in relation to the oscillator, so that the second parameter is positively or negatively updated in accordance with the detected distinction.

25. The method of claim 23, wherein:
the step of updating the first parameter comprises the step of updating the first parameter of the first model using an adaptive filter; and
the step of updating the second parameter comprises the step of updating the second parameter of the second model using an adaptive filter.

26. The method of claim 22, wherein the step of providing the oscillation characteristic comprises the step of:
providing a first characteristic signal in accordance with a first parameter of a first model, the first parameter being relating to an aging characteristic of the oscillator;
updating the first parameter in accordance with the difference signal when the input reference timing signal is available and in accordance with a past parameter when the input reference timing signal is unavailable, respectively;
providing a second characteristic signal in accordance with a second parameter of a second model, the second parameter being relating to a temperature characteristic of the oscillator;
updating the second parameter:
(i) in accordance with the difference signal, the first characteristic signal provided by the first processing unit, a temperature in relation to the oscillator and a voltage in relation to the oscillator, when the input reference timing signal is available; and
(ii) in accordance with a past parameter when the input reference timing signal is unavailable; and
combining the first and second characteristic signals to produce the characteristic signal, so as to vary the control component of the input control signal.

27. The method of claim 26, wherein the step of updating the second parameter comprises the step of:
detecting a distinction of the second parameter in accordance with the frequency of the oscillation output signal and the temperature in relation to the oscillator, so that the second parameter is positively or negatively updated in accordance with the detected distinction.

28. The method of claim 26, wherein:
the step of updating the first parameter comprises the step of updating the first parameter of the first model using an adaptive filter; and the step of updating the second parameter comprises the step of updating the second parameter of the second model using an adaptive filter.

29. The method of claim 24, wherein the step of detecting a distinction comprises the step of:

detecting the sign of variation of the oscillation frequency over time, in accordance with the frequency of the oscillation output signal and the temperature, the sign being used to update the second parameter positively or negatively.

30. An apparatus for generating a reference signal for use in a cellular base station, the apparatus comprising:

a receiver for generating an input reference timing signal when a cellular signal is available;

an oscillator for generating an oscillation output signal in response to a control component of an input control signal;

a difference detector for detecting a difference between the oscillation output signal and the input reference timing signal when the input reference timing signal is generated, thereby providing a difference signal; and a processor for varying the control component of the input control signal applied to the oscillator in accordance with the difference detected by the difference detector and a frequency dependent element relating to the oscillator, the frequency dependent element being provided in accordance with a characteristic model that is updateable in accordance with the difference signal provided by the difference detector when the input reference timing signal is generated, a frequency of the oscillation output signal generated by the oscillator being controlled in accordance with the varied control component of the input control signal.

31. The apparatus of claim 30, wherein the processor comprises:

a first processing unit for providing a first characteristic signal in accordance with a first parameter of a first model included in the characteristic model, the first parameter being relating to an aging characteristic of the oscillator, the first processing unit updating the first parameter in accordance with the difference signal when the input reference timing signal is generated and in accordance with a past parameter when the input reference timing signal is generated, respectively; and a second processing unit for providing a second characteristic signal in accordance with a second parameter of a second model of the characteristic model, the second parameter being relating to a temperature characteristic of the oscillator, the second processing unit updating the second parameter (i) in accordance with the difference signal, the first characteristic signal provided by the first processing unit and a temperature in relation to the oscillator, when the input reference timing signal is generated; and (ii) in accordance with a past parameter when the input reference timing signal is not generated, wherein the first and second characteristic signals are combined to produce the characteristic signal, so as to vary the control component of the input control signal.

32. The apparatus of claim 30, wherein the processor comprises:

a first processing unit for providing a first characteristic signal included in accordance with a first parameter of a first model included in the characteristic model, the first parameter being relating to an aging characteristic of the oscillator, the first processing unit updating the first parameter in accordance with the difference signal when the input reference timing signal is generated and in accordance with a past parameter when the input reference timing signal is not generated, respectively; and a second processing unit for providing a second characteristic signal in accordance with a second parameter of a second model of the characteristic model, the second parameter being relating to a temperature characteristic of the oscillator, the second processing unit updating the second parameter (i) in accordance with the difference signal, the first characteristic signal provided by the first processing unit, a temperature in relation to the oscillator and a voltage in relation to the oscillator, when the input reference timing signal is generated; and (ii) in accordance with a past parameter when the input reference timing signal is not generated, wherein the first and second characteristics signals are combined to produce the characteristic signals, so as to vary the component of the input control signal.

* * * * *

UNITED STATES PATENT AND TRADEMARK OFFICE
CERTIFICATE OF CORRECTION

PATENT NO. : 6,711,230 B1
DATED : March 23, 2004
INVENTOR(S) : Nicholls, Charles et al.

It is certified that error appears in the above-identified patent and that said Letters Patent is hereby corrected as shown below:

Column 8,
Line 39, "of/N" should read -- fo/N --.
Line 48, "of (=Nf)," should read -- fo (=Nf), --.
Line 51, "of/N" should read -- fo/N --.

Column 17,
Line 66, "with the e difference signal" should read -- with the difference signal --.

Column 24,
Line 41, "second characteristics signals" should read -- second characteristic signals --.
Line 42, "the characteristic signals," should read -- the characteristic signal, --;
Line 43, "vary the component" should read -- vary the control component --.

Signed and Sealed this

Ninth Day of November, 2004

JON W. DUDAS
*Director of the United States Patent and Trademark Office*

UNITED STATES PATENT AND TRADEMARK OFFICE
CERTIFICATE OF CORRECTION

PATENT NO.     : 6,711,230 B1
DATED          : March 23, 2004
INVENTOR(S)    : Nicholls, Charles et al.

It is certified that error appears in the above-identified patent and that said Letters Patent is hereby corrected as shown below:

Column 20,
Line 7, "whether the fist parameter" should read -- whether the first parameter --.

Column 21,
Line 3, "whether the fist parameter" should read -- whether the first parameter --.

Signed and Sealed this

Fifteenth Day of February, 2005

JON W. DUDAS
*Director of the United States Patent and Trademark Office*